(12) United States Patent
Ricking et al.

(10) Patent No.: US 7,267,791 B2
(45) Date of Patent: Sep. 11, 2007

(54) METHOD FOR THE PRODUCTION OF LIGHT-GUIDING LED BODIES IN TWO CHRONOLOGICALLY SEPARATE STAGES

(75) Inventors: Thorsten Ricking, Moers (DE); Cem Olkay, Witten (DE); Christine Weber, Esslingen (DE)

(73) Assignee: G.L.I. Global Light Industries GmbH, Kamp-Lintfort (DE)

( * ) Notice: Subject to any disclaimer, the term of this patent is extended or adjusted under 35 U.S.C. 154(b) by 474 days.

(21) Appl. No.: 10/500,043

(22) PCT Filed: Dec. 23, 2002

(86) PCT No.: PCT/DE02/04739

§ 371 (c)(1),
(2), (4) Date: Nov. 26, 2004

(87) PCT Pub. No.: WO03/056638

PCT Pub. Date: Jul. 10, 2003

(65) Prior Publication Data

US 2005/0084992 A1    Apr. 21, 2005

(30) Foreign Application Priority Data

Dec. 24, 2001  (DE) .............................. 101 63 117

(51) Int. Cl.
*B29C 45/14*    (2006.01)

(52) U.S. Cl. ................ 264/255; 264/328.8; 264/245; 264/272.17; 264/272.16

(58) Field of Classification Search .................. None
See application file for complete search history.

(56) References Cited

U.S. PATENT DOCUMENTS 3,609,475 A    9/1971   Kaposhilin
2001/0026011 A1   10/2001   Roberts et al.

FOREIGN PATENT DOCUMENTS

EP    0 635 744 A2    1/1995
JP       56165373 A   12/1981
JP       01069020 A    3/1989

*Primary Examiner*—Edmund H. Lee

(57) ABSTRACT

Disclosed is a method for producing light-guiding LED bodies in a mold, using a material that is flowable before becoming definitively solid. Each LED body comprises at least one light-emitting chip and at least two electrical connections that are connected to the chip. At least one flowable material is fed into the mold in chronologically separate steps via at least one of at least two locations. In a first step, the flowable material is fed into the mold so as to flow around the chip and the connections in that area. In further steps, one or several flowable materials are fed into areas other than the one in which the chip and connections are located. The inventive method for producing light-guiding LED bodies allows virtually all produced luminescent diodes to have the same optical characteristics and prevents the individual LED electronics from being spoiled through damage.

8 Claims, 3 Drawing Sheets

METHOD FOR THE PRODUCTION OF LIGHT-GUIDING LED BODIES IN TWO CHRONOLOGICALLY SEPARATE STAGES

This application is a National Stage of International Application No. PCT/DE02/04739, filed Dec. 23, 2002, which claims priority to DE 101 63 117.0, filed Dec. 24, 2001.

BACKGROUND OF THE INVENTION

Known from JP 1-69,020 A is a method for injection molding LEDs, whereby in a first step, the electronic components are first coated by means of molding in a blank mold. In this method, the blank mold extends to the front contour of the light emitting light-guiding body. In a second step, the cooled LEDs, which have been removed from the blank mold, are placed in a final mold in order to mold on the rear base parts of the LEDs by injection molding.

Also known, from EP 0,635,744 A2, is an LED whose LED body has a volume substantially greater than the volume of ordinary, standard LEDs. To this end, in one embodiment the LED body is assembled from several parts. The assembly is accomplished by gluing a standard LED into an additional, larger transparent light-guiding body, whose purpose is light emission. The volume of the standard LED here is only a fraction of the volume of the light guiding body. The glue joint degrades light emission, firstly because of the differences in density between the glued LED components and the adhesive, and secondly because of gas inclusions and different glue joint thicknesses. In another variant, the LED body and the separate light guiding body constitute a single part. With these LEDs, the molding process is subject to the risk of uncontrollable shrinkage during the cooling and curing phase. In the case of single-piece injection molding, the great quantity and rate of injection makes tearing of the wiring to the chip almost unavoidable in a large proportion of the light emitting diodes produced.

SUMMARY OF THE INVENTION

Method for producing light-guiding LED bodies from a material which is flowable before finally being solidified, in a mold, wherein the individual LED body comprises at least one light-emitting chip and at least two electrical terminals connected to the chip.

Consequently, the object of the present invention is to develop a method for producing light-guiding LED bodies in which nearly all light emitting diodes produced have the same optical properties, and rejects because of damage to the individual LED electronics are avoided.

This object is attained with the features of the main claim. To this end, at least one flowable material is introduced into the mold through at least two different locations at staggered times. The first introduction of the flowable material is performed to surround the chip and terminals in that region. The additional introduction(s) of one or more flowable materials takes place in regions that lie outside the region of the chip and terminals.

Using the method according to the invention, light emitting diodes are produced in two sequential steps, for example by injection molding in a mold. In a first step, for example, after insertion of the electronic components, a small quantity of plastic is introduced into an injection molding tool, for example from the rear of the future LED. The quantity is just large enough to fully coat the electronic components by casting or injection molding. This small quantity cures rapidly, thus forming good protection for the electronic components. In particular the delicate, thin and free-standing bond wire, which connects the anode to the light-emitting chip, is permanently fixed in place and protected.

While the material that has just been introduced is still in the plasticizing phase, in a second step new material can be injected from another injection point to fill the remainder of the mold, for example a large volume. Since there is now no risk of damaging the electronic components, the injection molding process can take place with a high flow volume and high injection rate. Even a subsequent injection-compression molding process which may be performed cannot cause any damage to the bond wire. The materials that have been introduced in chronological sequence join to form a homogeneous optical body so that predictable, precise light emission is possible with minimum attenuation.

DESCRIPTION OF THE DRAWINGS

Further details of the invention are clear from the dependent claims and the description below of a schematically represented example embodiment.

DESCRIPTION OF THE PREFERRED EMBODIMENT

Figure 1:
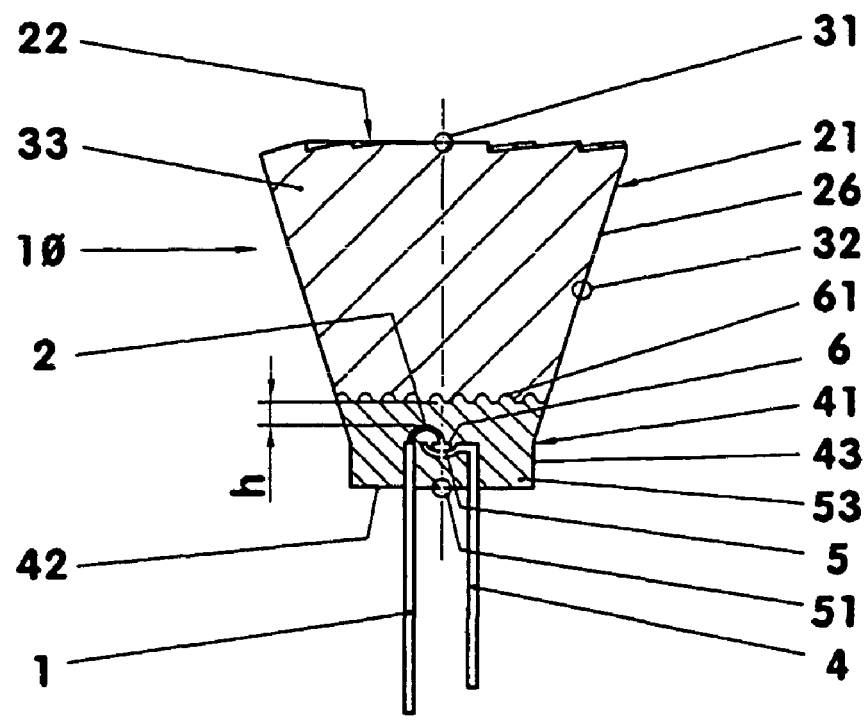
FIG. 1: LED body in longitudinal section.
Figure 2:
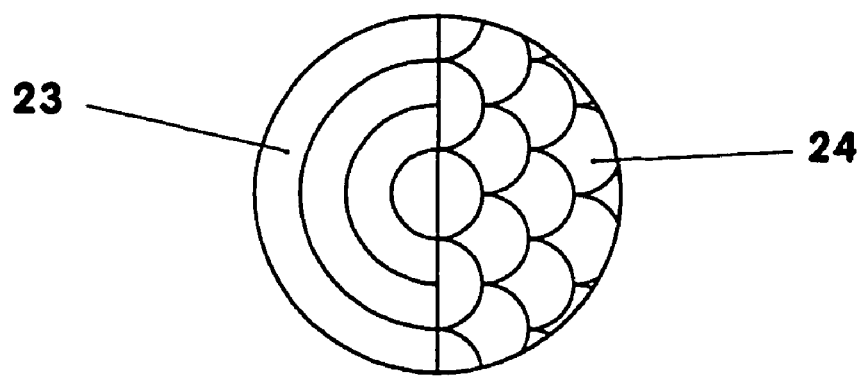
FIG. 2: Top view of FIG. 2 [sic]

FIGS. 1 and 2 show a large-volume LED (10) whose light-guiding body (21, 41) has been produced by injection molding in at least two injection steps.

The LED (10) shown in FIG. 1 has a body that is theoretically divided into two parts. The bottom part of the body is a so-called protective body for electronics (41), while the upper part of the representation is called the light-emitting body (21).

The protective body for electronics (41), in FIG. 1 the lower section of the LED (10), usually surrounds the electrical terminals (1, 4), the light-emitting chip (6), a bond wire (2) and a reflector dish (5). The latter is part of the cathode (4), for example. The chip (6) sits in the reflector dish (5). The chip (6) contacts the anode (1) through the bond wire (2). The material of the protective body for electronics (41) here is a transparent, e.g. colored, injection-moldable thermoplastic (53), for example a modified polymethyl methacrylimide (PMMI).

Figure 3:
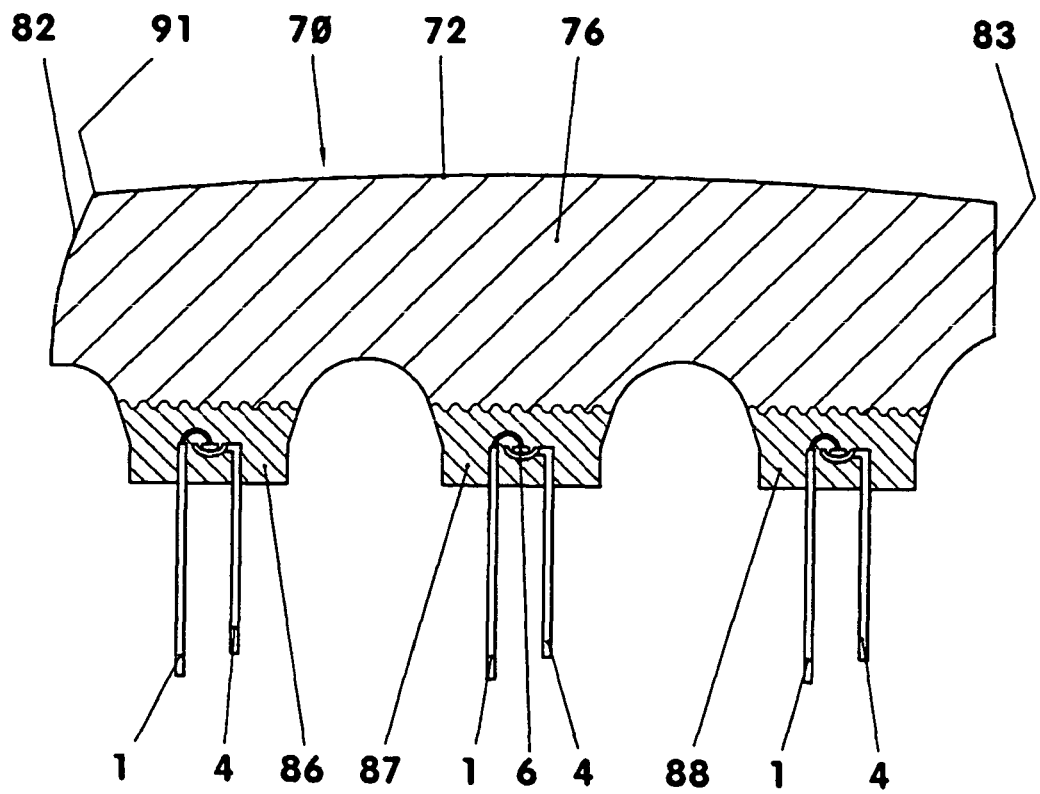
FIG. 3: Combined LED body in longitudinal section.

The light-guiding body (21) is arranged above the protective body for electronics (41). Located between the two bodies (21, 41) is a possibly hypothetical parting line (61), which is shown in FIGS. 1 and 3 as a wavy line. The light-guiding body (21) has the shape of a truncated cone, for example. As shown in FIG. 2, the end face (22) thereof opposite the chip (6), referred to as the primary emergent surface, has its respective halves embodied as a Fresnel lens (23) and a diffusing surface (24) with a scale structure. Depending on its optical function, the primary emergent surface (22) can have a simple geometric curvature, cf. convex or concave forms, or any desired free-form solid shape. It can also be constructed from a combination of individual regular geometric surface elements such as cones, pyramids, hemispheres, toroidal sections, or the like.

The side wall of the truncated cone shown in FIG. 1 is what is called a secondary-emergent surface (26). It is a lateral surface here by way of example only. This surface (26) can be made smooth or profiled. It can also be provided, either partially or completely, with a transparent or opaque coating. For instance, it may be galvanically metallized as an additional reflector surface. It can take on almost any desired free-form shape. With smooth solid shapes, for example a paraboloid inner surface, total internal reflection can occur even without separate metallization.

To produce the LED (10), first a low-viscosity material (53) is injected in the injection mold into which the LED electronic components (1-6) extend, for example from below. An opening in the injection mold, which in FIG. 1 is located at a point marked with a circle labeled (51), serves as the injection point (51). Subsequently, the plastic (53), for example, is injected directly under the reflector dish (5). Theoretically this injection point (51) can be at any desired point on the outside contour of the protective body for electronics (41). The outside contour here includes a base (42) and a lateral surface (43) that is cylindrical in regions, among other things.

In this first injection procedure, just enough plastic (33) is introduced into the mold that, for example, the bond wire (2) as the most exposed component is fully covered and the minimum distance from the bond wire (2) to the parting line (61) is at least 0.5 mm. If desired for clear definition of this parting line (61), a force plug can be inserted in the mold, which is removed or moved or pivoted back to the side prior to the second casting or injection molding manufacturing step. The mold face of the force plug oriented towards the electronic components can be shaped to achieve a certain optical effect, among other reasons.

Once the plastic (53) forming the protective body for electronics (41) has reached a viscous stage, this is for example only a few seconds after injection, the plastic (53) [sic], for example, is injected into the remaining volume of the mold above the parting line (61). This is accomplished, for example, through an injection point (31) in the end face (22) or an injection point (32) in the secondary emergent surface (26); see FIG. 1. The incoming plastic (33) joins with the still-viscous plastic (53) of the protective body for electronics (41); if applicable, it also solubilizes the already-hardened surface. The cross-linking or melting in the parting line (61) is so complete that the two plastics (33, 53) form a homogeneous body. Refraction of light in the region of the then-vanished parting line (61) is avoided.

Alternatively, for special applications refraction can be intentionally produced through means such as the use of plastics with different densities. If desired, multiple layers of different types of plastic are injected for this purpose.

Figure 4:
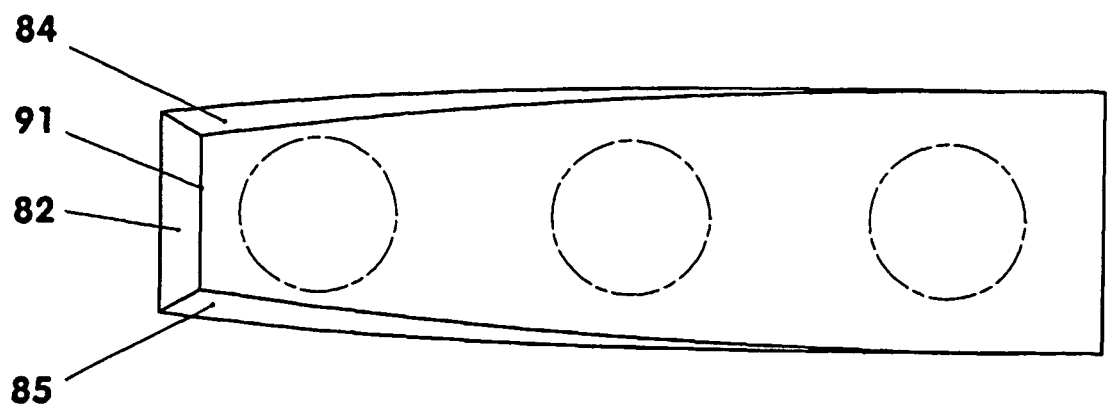
FIG. 4: Top view of FIG. 3.
Figure 5:
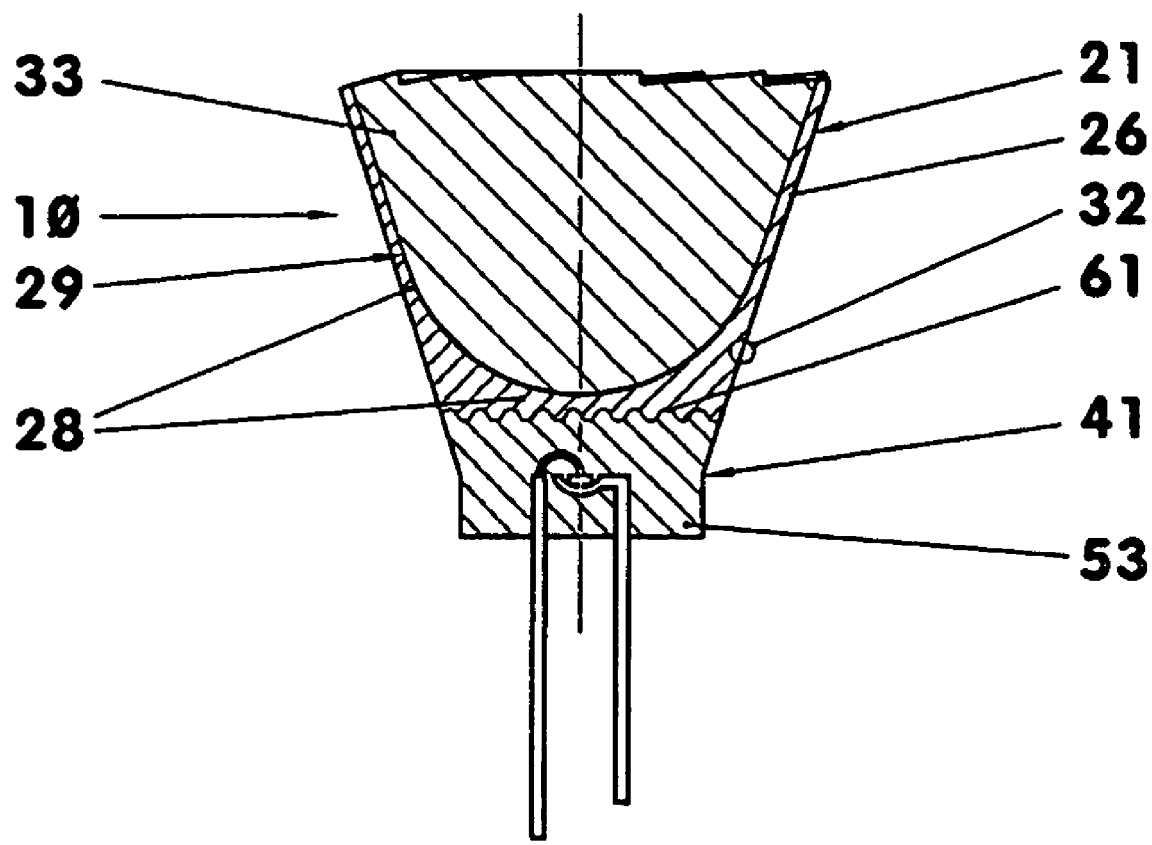
FIG. 5: LED body in longitudinal section with separate light-guiding body.

FIGS. 3 and 4 show a composite LED (70) in longitudinal section and in top view. The example embodiment shown comprises three protective bodies for electronics (86-88), each including the electronic components (1-6) and a light-guiding body (76). The protective bodies for electronics (86-88) and the light-guiding body (76) are produced, for example, in an injection mold using the method described above. They form an indivisible unit after the injection process.

The light-guiding body (76) has a primary emergent surface (72) arranged opposite the chips (6); see FIG. 1. Four secondary emergent surfaces (82-85) adjoin the primary emergent surface (72).

The compound LED (70) shown is, for example, a motor vehicle rear signal lamp that is integrated in the region of a lateral edge (91) of the vehicle. Within the composite LED (70), the area in front of the protective body for electronics (86) represents a turn signal, the area in front of the protective body for electronics (87) represents a brake light, and the area in front of the protective body for electronics (88) represents a taillight, for example. In this context, the secondary emergent surface (82) shown in FIGS. 3 and 4 has the function of an auxiliary primary emergent surface. It is intended to radiate light to the side. To achieve high trueness of shape and precision of contour, an injection-compression molding process can be used. It is also conceivable to separately manufacture the primary emergent surfaces (22, 72) with their lens and/or diffusing surfaces, for example, and place them in the injection mold ahead of time. The same applies to the secondary emergent surfaces (26, 82-85).

In another alternative, a separate light-guiding body (29) is placed in the mold above the electronic components (1-6). In this case, the light-guiding body (29) still has unfinished secondary emergent surfaces, for example, which is to say that its present side surfaces do not contact the mold. Then, the protective body for electronics (41) is first cast or injection-molded. In another process step, the still empty intermediate spaces (28) between the protective body for electronics (41) and the light-guiding body (29) and between the light-guiding body (29) and the mold are filled. The plastic (33) that is introduced last melts the light-guiding body (29) together with the protective body for electronics (41), achieving high precision of form and at a rapid cooling rate. The latter is a function of factors including the prior insertion of the large-volume, cooled light-guiding body (29), which here comes into contact with the newly injected liquid plastic (33) only in a relatively thin edge region.

Here, to, an injection-compression molding step can also be added.

LIST OF REFERENCE NUMBERS

1 Terminal, anode, electrode
2 Bond wire, aluminum wire
4 Terminal, cathode, electrode
5 Reflector dish
6 Chip
10 LED
21 Light-guiding body
22 End face, primary emergent surface
23 Fresnel lens
24 Diffusing surface
26 Lateral surface, secondary emergent surface, reflector surface
28 Intermediate spaces
29 Light-guiding body, separate
31, 32 Injection points
33 Material of (21)
41 Protective body for electronics
42 Base, region
43 Lateral surface that is cylindrical in some regions
51 Injection point
53 Material of (41)
61 Parting line
70 LED composite
72 Primary emergent surface
76 Light-guiding body
82-85 Secondary emergent surface
86-88 Protective bodies for electronics
91 Edge of vehicle and compound LED

The invention claimed is:

1. Method for producing light-guiding LED bodies from a material which is flowable before finally being solidified, in a mold, wherein the individual LED body comprises at least one light-emitting chip and at least two electrical terminals connected to the chip, the method comprising:
   at least one flowable material being introduced into the mold through at least two different locations at staggered times, and
   wherein the first introduction of the flowable material is performed to surround the chip and terminals, and
   wherein the additional introductions of one or more flowable materials take place in a region that lies outside the region of the chip and terminals.

2. Method for producing light-guiding LED bodies from claim 1, further comprising the time offset between the introduction of the first and the second flowable material being shorter than the solidification phase of the material introduced first.

3. Method for producing light-guiding LED bodies from claim 1, wherein the LED body has a volume of at least 0.3 ml.

4. Method for producing light-guiding LED bodies from claim 1, wherein during the first introduction of flowable material, the chip and/or its terminals are embedded enough such that the shortest distance to the subsequently introduced flowable material is at least 0.5 mm.

5. Method for producing light-guiding LED bodies from claim 1, wherein the first introduction of flowable material takes place between the terminals on the chip underside.

6. Method for producing light-guiding LED bodies from claim 1, wherein the direction in which the second flowable material is introduced differs from the direction in which the first flowable material is introduced.

7. Method for producing light-guiding LED bodies from claim 1, wherein the quantity of material of at least one later-introduced material is at least five times greater than the quantity of material first introduced.

8. Method for producing light-guiding LED bodies from claim 1, wherein the sequentially introduced materials are identical.

* * * * *